US005212664A

United States Patent [19]
Shinohara

[11] Patent Number: 5,212,664
[45] Date of Patent: May 18, 1993

[54] INFORMATION CARD WITH DUAL POWER DETECTION SIGNALS TO MEMORY DECODER

[75] Inventor: Takayuki Shinohara, Itami, Japan

[73] Assignee: Mitsubishi Denki Kabushiki Kaisha, Tokyo, Japan

[21] Appl. No.: 777,445

[22] Filed: Oct. 16, 1991

Related U.S. Application Data

[63] Continuation of Ser. No. 503,676, Apr. 13, 1990, abandoned.

[30] Foreign Application Priority Data

Apr. 5, 1989 [JP] Japan .................................... 1-85983
Nov. 21, 1989 [JP] Japan .................................... 1-304245

[51] Int. Cl.$^5$ ............................................... G11C 7/00
[52] U.S. Cl. ..................................... 365/229; 365/228; 365/230.06; 235/441; 235/492
[58] Field of Search .................... 365/228, 229, 230.06; 235/441, 492

[56]     References Cited
U.S. PATENT DOCUMENTS

| | | | |
|---|---|---|---|
| 3,562,555 | 2/1971 | Ahrons | 365/229 |
| 4,399,524 | 8/1983 | Muguruma et al. | 365/229 |
| 4,457,021 | 6/1984 | Belisomi | 365/229 |
| 4,692,903 | 9/1987 | Borg et al. | 365/229 |
| 4,800,533 | 1/1989 | Arakawa | 365/228 |
| 5,051,958 | 9/1991 | Arakawa | 365/228 |

FOREIGN PATENT DOCUMENTS

| | | |
|---|---|---|
| 0111153 | 6/1984 | European Pat. Off. . |
| 0187953 | 7/1986 | European Pat. Off. . |
| 0241693 | 10/1987 | European Pat. Off. . |
| 58-199494 | 11/1983 | Japan ............. 365/229 |
| 60-72012 | 4/1985 | Japan ............. 365/229 |
| WO81/02362 | 8/1981 | World Int. Prop. O. ....... 365/229 |

Primary Examiner—Joseph E. Clawson, Jr.
Attorney, Agent, or Firm—Leydig, Voit & Mayer

[57]     ABSTRACT

An information card includes a plurality of volatile memory circuits backed up by an internal battery when an external power supply is OFF and a capacitor connected between an H active enable input line for enabling an address decoder which selects the plurality of volatile memory circuits and a low voltage common power supply to reduce the high frequency impedance of H active enable input line.

3 Claims, 4 Drawing Sheets

INFORMATION CARD WITH DUAL POWER DETECTION SIGNALS TO MEMORY DECODER

This application is a continuation of application Ser. No. 07/503,676, filed Apr. 13, 1990, now abandoned.

FIELD OF THE INVENTION

The present invention relates to an information card comprising a plurality of volatile memory circuits backing up data stored in the volatile memory circuits with an internal battery and, more particularly, to an information card comprising means for preventing stored data from being destroyed by external noise when an external power supply is OFF or when a memory is backed up by the internal battery.

BACKGROUND OF THE INVENTION

FIG. 3 is a block diagram of a conventional information card comprising a plurality of integrated circuits including volatile memory circuits. In FIG. 3, reference numeral 3 designates a supply voltage detecting circuit for monitoring the voltage of an external 5 V power supply 7 supplied through a power supply input terminal 25. The supply voltage detecting circuit 3 has its first output terminal 4 connected to a base of a PNP transistor 6. Its output turns the transistor 6 ON or OFF and switches between the external 5 V power supply 7 and the internal power supply 19. In addition, a second output terminal 5 of the supply voltage detecting circuit 3 is connected to a "H" active enable input terminal 9 of an address decoder 8 and a "H" active control input terminal 15 of a buffer 14 for a card enable input. An output 11 of the address decoder 8 is connected to chip select input terminals $13_1$ to $13_n$ of the plurality of volatile memory circuits $12_1$ to $12_n$, of the memory card. The volatile memory circuits $12_1$ to $12_n$ are commonly connected to a power supply line on the collector side of the transistor 6 which switches between the external 5 V power supply 7 and the internal power supply 19. The power supply line is connected to a primary battery 18 through a diode 16 for preventing the flow of a reverse current and a current controlling resistor 17. Data stored in the volatile memory circuits $12_1$ to $12_n$ is backed up by the primary battery 18. In addition, reference numeral 22 designates a resistor for pulling up an input of the buffer 14 for the card enable input to a voltage of the external power supply 7, reference numeral 21 designates a card enable terminal, reference numeral 24 designates a higher rank address input terminal for supplying a higher rank address input of the memory card to the address decoder 8, and reference numeral 26 designates a 0 V power supply input terminal. The supply voltage detecting circuit 3, the address decoder 8, the volatile memory circuits $12_1$ to $12_n$, the buffer 14 and the like can be an IC (integrated circuit).

Next, operation of this conventional example will be described in reference to an operating signal waveform of the supply voltage detecting circuit 3 shown in FIG. 2. In FIG. 3, when memory is backed up, that is, when a voltage of the external 5 V power supply 7 is less than, for example 4.25 V (FIG. 2(a)), it is detected by the supply voltage detecting circuit 3 and an output of the first output terminal 4, that is, an absorption current output is turned OFF (figure,) and a voltage output of the second output terminal 5 attains "L" level (FIG. 2(b)). Therefore, the transistor 6 is turned OFF and the "H" active enable input terminal 9 of the address decoder and the "H" active output control input terminal 15 of the buffer 14 for the card enable input the "L" level. Therefore, all of the outputs 11 of the address decoder 8 attain "H" level and all of the volatile memory circuits $12_1$ to $12_n$ in the memory card attain a standby state with a supply voltage supplied from the internal power supply 19, that is, the primary battery 18, and data in the memory circuits $12_1$ to $12_n$ is stored.

A description is given of a case where in the above memory backup state, there is an electrostatic discharge through the memory card body (more specifically, an electrostatic discharge generated when the memory card held by a person charged with electricity is inserted into equipment). If a discharge current or an induced current I [A] due to the discharge current flows into the "H" active enable input line 9a (which is the same as the "H" active output control input line of the card enable input buffer 14) of the address decoder 8 for $t_0$ [sec], a voltage expressed by the following equation is generated on the "H" active enable input line 9a of the address decoder 8, that is;

$$V = \frac{1}{C_0} \int_o^{to} I dt \; [V] \quad (1)$$

where $C_0$ line capacitance [F] between the enable input line 9a and the 0 V power supply 20. When a voltage V exceeds a threshold voltage of the "H" active enable input line 9a of the address decoder 8, an output signal 11 appears and one of the volatile memory circuits $12_1$ to $12_n$ becomes active, which could cause the stored data in the memory circuits $12_1$ to $12_n$ to be destroyed (erroneously overwritten).

Since the conventional memory card is structured as described above, the line capacitance between the enable input line of the address decoder and the 0 V power supply is small (several pF), so that the data stored in the memory card is sometimes destroyed by a comparatively small discharge current I. For example, when V=2 volts, $C_0$=5 pF, $t_0$=100 nsec, and $$\int_o^{to} I dt = I \times t_0,$$

a discharge current I is as follows;

$$I = \frac{V \times C_0}{t_0}$$
$$= \frac{2 \times 5 \times 10^{-12}}{100 \times 10^{-9}}$$
$$= 1 \times 10^{-4} \; [A] = 0.1 \; [mA]$$

However, the address decoder erroneously operates at this current, causing the data stored in the memory card to be destroyed.

SUMMARY OF THE INVENTION

The present invention was made in order to solve the above problems and it is an object of the present invention to provide an information card in which stored data is not destroyed at the time of backup of the memory card.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

An information card in accordance with the present invention comprises a capacitor provided between an "H" active enable input line of an address decoder selecting among a plurality of volatile memory circuits and a low voltage common power supply (0 V power supply 20) to reduce high frequency impedance of the "H" active enable input line. In addition, it comprises a resistor for discharging an electric charge in the capacitor when an external power supply (external 5 V power supply) is OFF.

According to the present invention, since the capacitor is provided between the "H" active enable input line of the address decoder and the low voltage common power supply, high frequency impedance of the "H" active enable input line of the address decoder can be reduced. In addition, since the resistor is provided between the active enable input line and the capacitor, the electric charge in the capacitor can be discharged when the external power supply (external 5 V power supply) is OFF.

DETAILED DESCRIPTION OF THE DRAWINGS

FIG. 1 is a block diagram showing an information card in accordance with an embodiment of the present invention;

FIG. 2(a)-2(c) are graphs of wave forms of the operation of a supply voltage detecting circuit in the embodiment of the present invention and a conventional example;

DETAILED DESCRIPTION OF THE PREFERRED EMBODIMENTS

An embodiment of the present invention will be described in detail with reference to the drawings.

Figure 1:
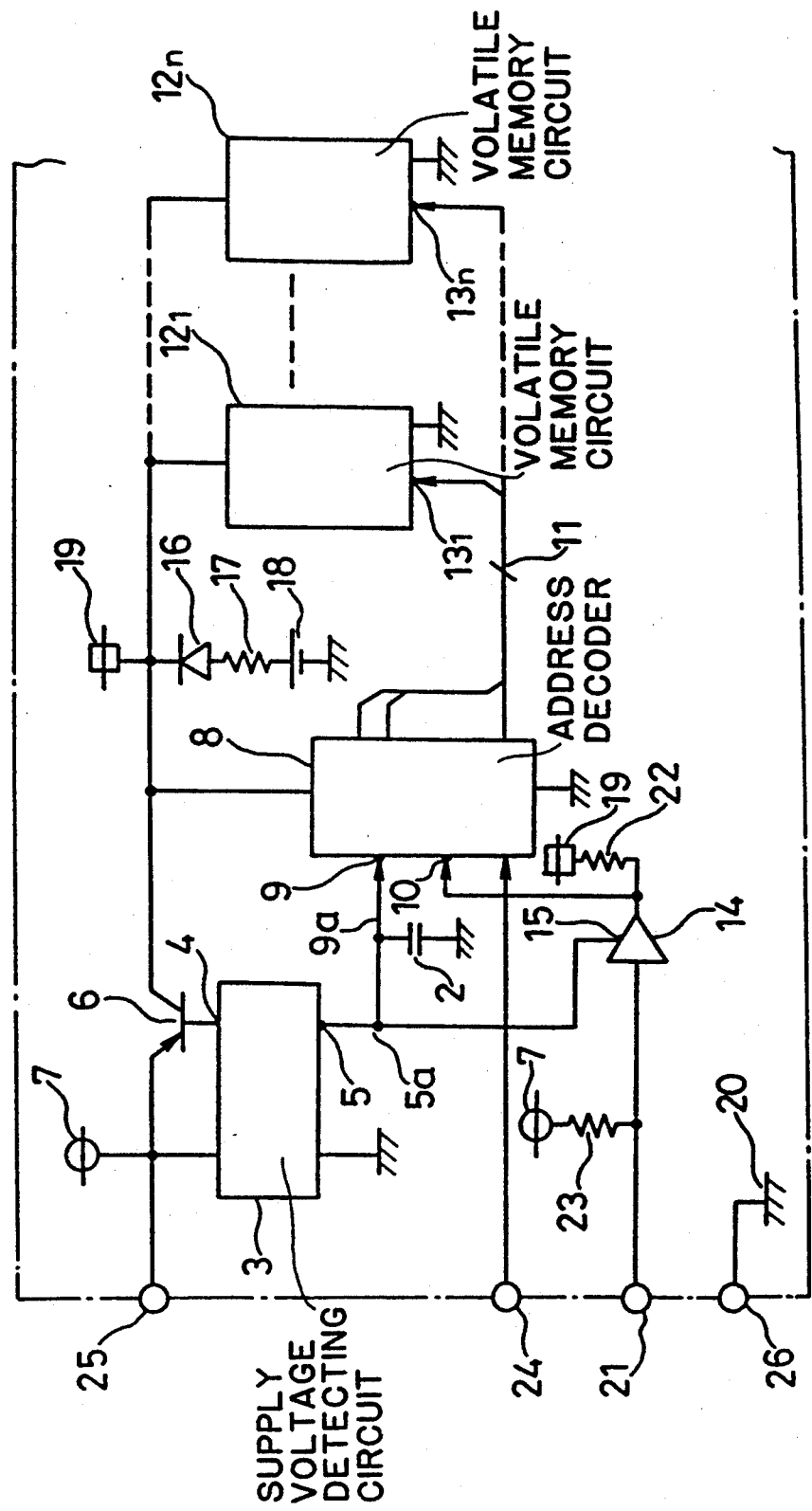
Figure 3:
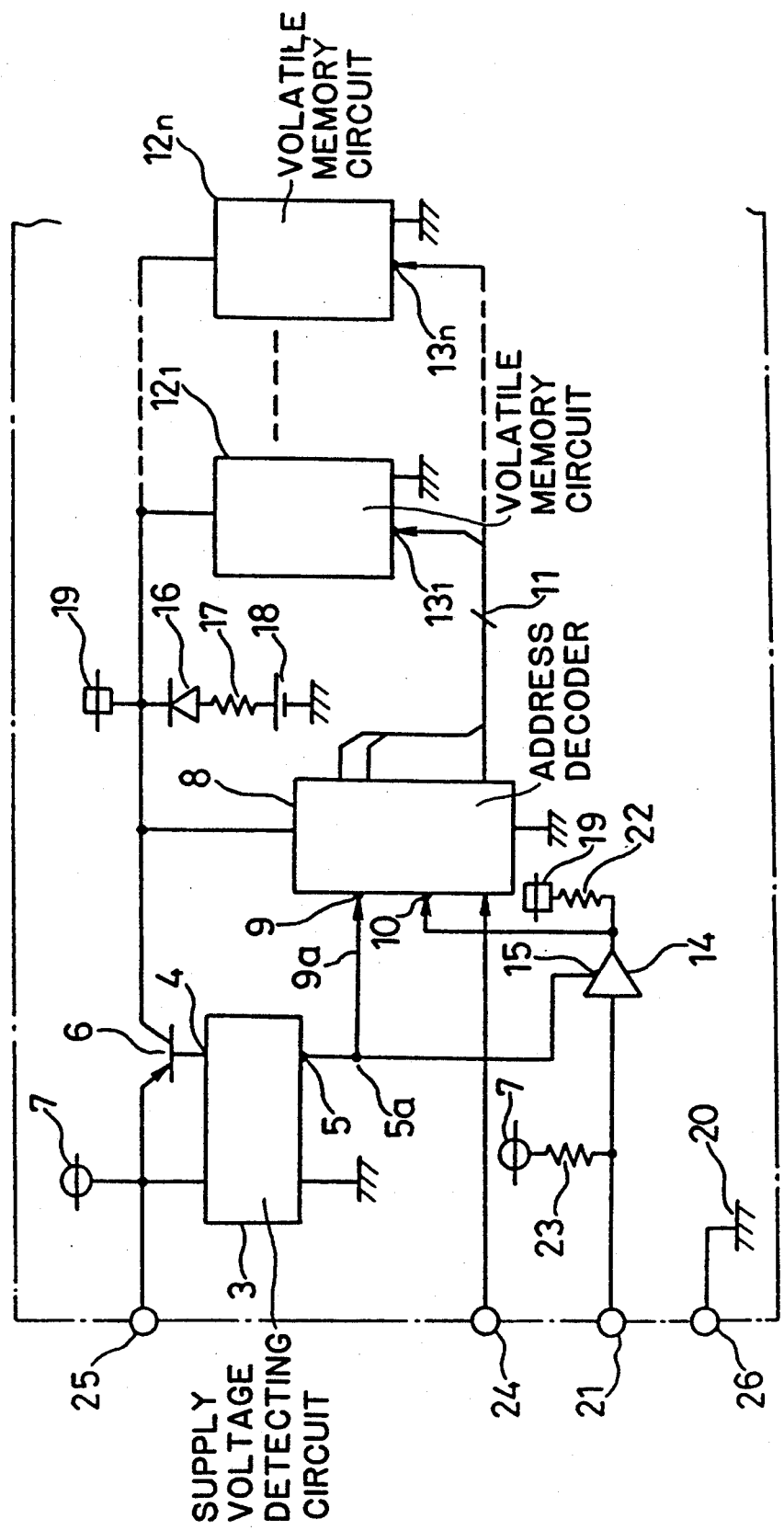
FIG. 3 is a block diagram showing a conventional information card.

FIG. 1 is a block diagram showing a memory card used as an information card in accordance with an embodiment of the present invention. According to the embodiment of the present invention, a capacitor 2 for reducing the high frequency impedance of an a "H" active enable input line 9a is provided between the "H" active enable input line 9a of an address decoder 8 selecting a plurality of volatile memory circuits $12_1$ to $12_n$ and a 0 V power supply (low voltage common power supply) 20. The structure other than that is the same as that shown in FIG. 3.

In FIG. 1, reference numeral 3 designates a supply voltage detecting circuit that monitors the voltage of an external 5 V power supply 7 supplied through a power supply input terminal 25. When the voltage of the 5 V power supply 7 supplied from the external power supply becomes a set voltage (4.25 V) or more, the supply voltage detecting circuit 3 absorbs current on a first output terminal 4 and turns ON a PNP transistor 6 which switches to the external 5 V power supply 7 from an internal power supply 19. Then, when the voltage of the external 5 V power supply 7 is less than 4.24 V, a current absorbing output is turned OFF and the transistor 6 is turned OFF. Then, a card internal circuit comprising the plurality of volatile memory circuits $12_1$ to $12_n$ is operated by the internal power supply 19. At this time, a second output terminal 5 of the supply voltage detecting circuit 3 generates an output of "H" level when the voltage of the external 5 V power supply 7 is 4.25 V or more and it generates an output (memory protect output) of "L" level when it is less than 4.25 V. The output is connected to the "H" active enable input terminal 9 of the address decoder 8 through an "H" active output control input terminal 15 of the buffer 14 for the card enable input. In addition, the capacitor 2 is connected between the "H" active enable input line 9a and a memory protect output line 5a, to the "H" active enable input terminal 9 of the address decoder 8 and the 0 V power supply 20 to reduce the high frequency impedance, of the "H" active enable input line 9a. An output 11 of the address decoder 8 is connected to "L" active chip select input terminals $13_1$ to $13_n$ of the volatile memory circuits $12_1$ to $12_n$. Reference numeral 16 designates a diode for preventing the flow of a reverse current, which prevents a charging current from flowing into a primary battery 18 reference numeral 17 designates a current controlling resistor for controlling a charging current flowing into the primary battery 18 if the diode 16 short-circuits, reference numeral 22 designates a resistor for pulling up an output of the buffer 14 for the card enable input to the internal power supply 19, reference numeral 23 designates a resistor for pulling up an input of the buffer 14 for the card enable input, to the external power supply 7 and reference numeral 24 designates a higher rank address input terminal for supplying higher rank address of the memory card to the address decoder 8. Reference numeral 21 designates a card enable input terminal of the memory card and reference numeral 26 designates a 0 V power supply input terminal of the memory card.

Next, operation of the above structure in accordance with the embodiment of the present invention will be described with reference to an operating waveform of the supply voltage detecting circuit 3 shown in FIG. 2.

Figure 2A:
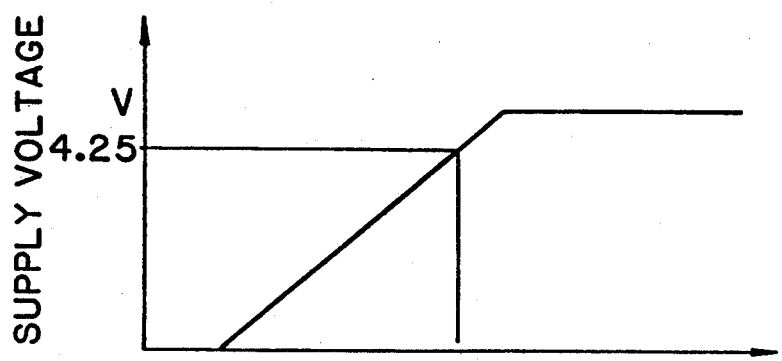
Figure 2B:
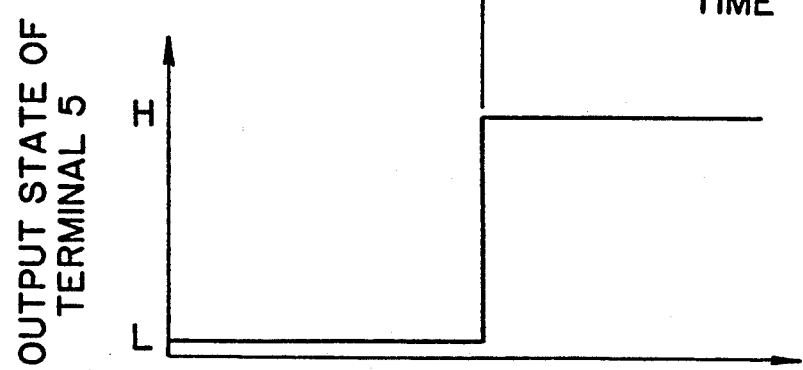
Figure 2C:
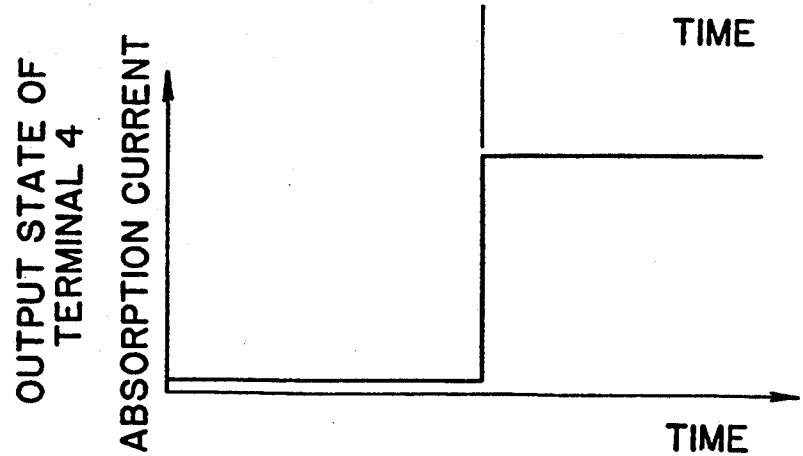

In FIG. 1, when the memory is backed up, that is, when the external 5 V supply voltage is less than 4.25 V (FIG. 2(a)), the output of the first output terminal 4 of the supply voltage detecting circuit 3, that is, an absorption current, is turned OFF (FIG. 2(c)) and the second output terminal 5 attains "L" level (FIG. 2(b)). Therefore, the transistor 6 is turned OFF and a supply voltage is applied to the volatile memory circuits $12_1$ to $12_n$ from the internal power supply 19, that is, from the primary battery 18. At the same time, the "H" active enable input 9 of the address decoder 8 attains "L" level and then all chip select inputs of the volatile memory circuits $12_1$ to $12_n$ attain "H" level, whereby all the volatile memory circuits $12_1$ to $12_n$ attain a standby state.

In the above memory backup state, a voltage V generated on the "H" active enable input line 9 of the address decoder 8 by an electrostatic discharge through the memory card body is expressed by the following equation, that is, $$V = \frac{1}{C} \int_{o}^{to} I dt \, [V] \quad (2)$$

where C is capacitance [F] of the capacitor 2 inserted between the enable input of the address decoder 8 and the 0 V power supply 20, I is a current [A] that flows into the enable input line of the address decoder 8 because of the electrostatic discharge, and $t_0$ is time [sec] while the current I flows. However, if an amount of electric charge $$\int_0^{t_0} I \, dt$$

generated at the enable input of the address decoder 8 by the electrostatic discharge in the equation (1) is equal to that in the equation (2), a voltage generated on the enable input of the address decoder 8 by the electrostatic discharge is reduced $C_0/C$-fold because the capacitor 2 is inserted. For example, when $C_0$ is several pF and C is several 100 pF, the voltage generated at the enable input of the address decoder 8 is by a factor of 100. As a result, erroneous operation of the address decoder 8 caused by external noise such as electrostatic discharge at the time of backup of the volatile memory circuits $12_1$ to $12_n$ is prevented and also destruction of internal stored data is prevented.

Figure 4:
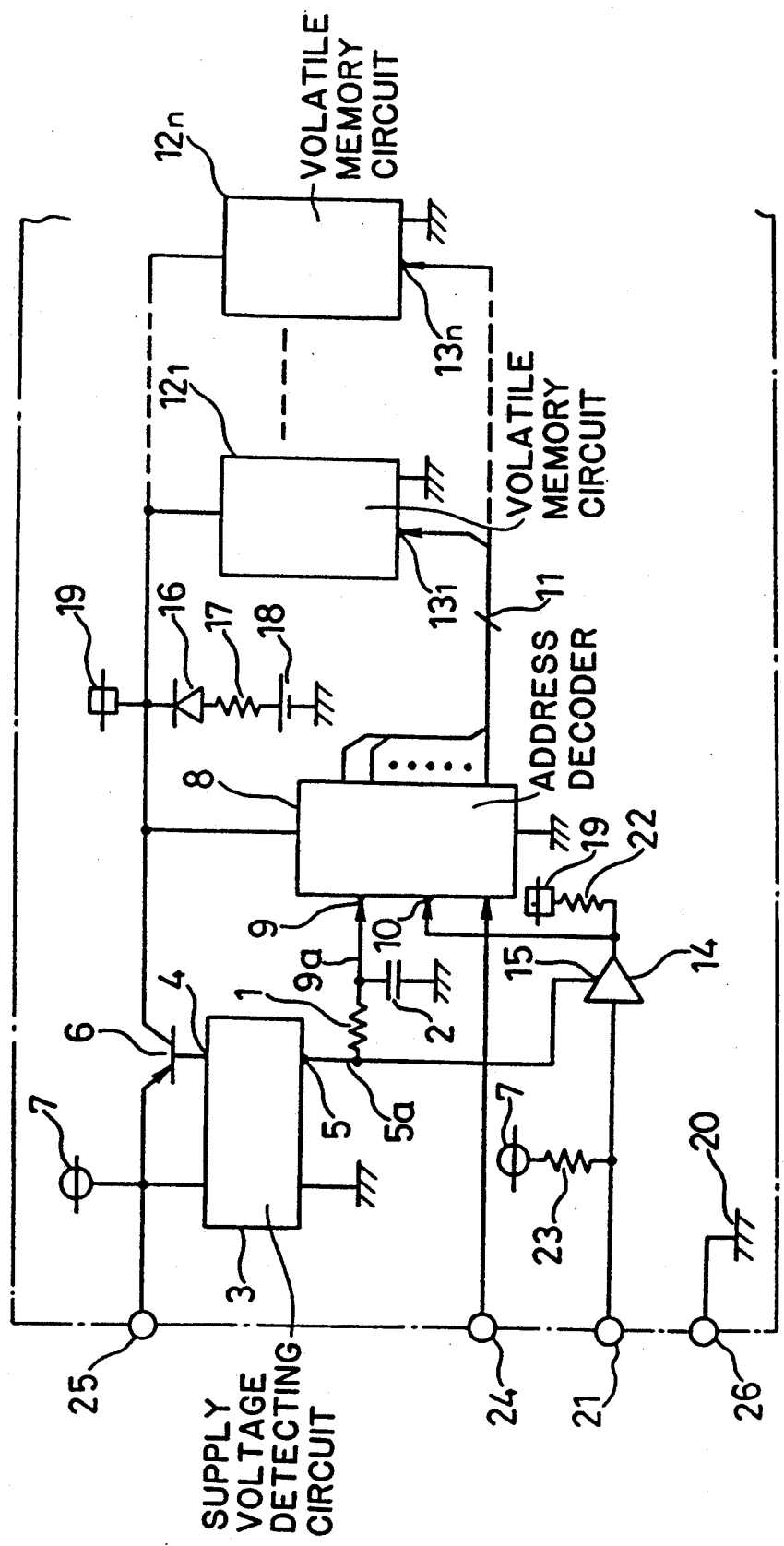
FIG. 4 is a block diagram showing an information card in accordance with another embodiment of the present invention.

Next, a description will be given of operation when the external power supply is OFF in a second embodiment of the present invention in reference to FIG. 4. This embodiment is different from the first embodiment in that a resistor 1 is provided between the H active enable input line 9a and the capacitor 2 because discharge of the capacitor 2 sometimes causes delay of a memory protect output in the first embodiment. More specifically, an electric charge Q[C] in the capacitor 2 is discharged through an output resistor $R_0[\Omega]$ (not shown) of the second output terminal 5 of the supply voltage detecting circuit 3. When time $t=0$, discharge is started. A power supply $V_p[v]$ of the memory protect output line 5a after t [sec] is expressed as follows;

$$V_p = \frac{Q}{C} \exp\left(-\frac{t}{CR_0}\right) [v] \quad (3)$$

The memory protect output is connected to the "H" active enable terminal 9 of the address decoder 8 3 and the "H" active output control terminal 15 of the buffer 14 for the card enable input. Since the card enable input terminal 21 is pulled up to the external 5 V power supply 7 by the resistor 23, the card enable input terminal 21 falls in accordance with almost the same signal waveform as the external 5 V power supply 7 falls. Therefore, the voltage of the external 5 V power supply 7 falls more steeply than the power supply $V_p$ shown in the equation (2). Then, when the card enable is input, that is, the input level of the external 5 V power supply 7 attains "L" level while the output control terminal 15 of the buffer 14 for the card enable input is at "H" level, the address decoder 8 operates and one of the volatile memory circuits $12_1$ to $12_n$ becomes active, causing a possibility that data in the memory circuits is destroyed (erroneously written).

This problem can be solved by providing the resistor 1 as described above in the following manner. When the external 5 V power supply 7 is supplied, a signal at "H" level is output on the second output terminal 5 of the supply voltage detecting circuit 3 and the capacitor 2 connected between the "H" active enable terminal 9 of the address decoder 8 and the 0 V power supply 20 through the output and the resistor 1 is charged to the same level as the second output terminal 5 of the supply voltage detecting circuit 3. When the external 5 V power supply 7 is turned OFF from this state and the external 5 V power supply 7 is less than 4.25 V, the second output terminal 5 of the supply voltage detecting circuit 3 outputs a signal at "L" level and then memory protection is applied. At this moment, as the capacitor 2 charged at "H" level starts to discharge through the resistor 1, the memory protection is not immediately applied to the "H" active enable input terminal 9 of the address decoder 8. More specifically, when the external 5 V power supply 7 is ON, an electric charge in the capacitor 2 is Q [C] and a voltage $V_{CE}$ of the "H" active input terminal 9 of the address decoder 8 t [sec] after the external 5 V power supply 7 fell below 4.25 is as follows;

$$V_{CE} = \frac{Q}{C} \exp\left(-\frac{t}{CR}\right) [v] \quad (4)$$

where, C is electrostatic capacitance [F] of the capacitor 2 and R is a resistance value [$\Omega$] of the resistor 1. When the value R [$\Omega$] of the resistor 1 is set considerably larger than the output resistance $R_0$ of the second output terminal 5 of the supply voltage detecting circuit 3, the voltage on the second output terminal 5, that is, the voltage on the "H" active output control input terminal 15 of the buffer 14 for the card enable input, attains "L" level without any influence from the capacitor 2 and the output of the buffer 14 becomes high impedance. Therefore, the "L" active enable terminal 10 of the address decoder 8 is pulled up to the internal power supply 19 by the resistor 22, whereby it attains "H" level, delay of the memory protect is prevented and destruction of the internal stored data due to the delay of the memory protect output is prevented when the external power supply is OFF. The amount of the electrostatic discharge when the memory card in accordance with this embodiment of the present invention is backed up is the same as that of the memory card without the resistor 1.

According to the above embodiments of the present invention, delay of the memory protect output due to the capacitor 2 between the "H" active enable input line 9a and the 0 V power supply 20 when the external power supply is OFF is prevented because the resistor 1 is inserted between the memory protect signal line 5a output from the second output terminal 5 of the supply voltage detecting circuit 3 and the "H" active enable input line 9a of the address decoder 8. More specifically, since a change in the potential from the capacitor 2 is not immediately transferred to the memory protect signal line 5a because of the resistor 1, the memory protect output is not likely to be influenced thereby. As a result, delay of the memory protect output is prevented and also destruction of data inside the memory is prevented.

Although the voltage of the external power supply is 5 V in the above embodiments of the present invention, the voltage of the external power supply may be set in accordance with an operational voltage of the circuit elements. In addition, the internal battery is not limited to the primary battery and a secondary battery may be used.

According to the present invention, since a capacitor for reducing high frequency impedance of the "H" active enable input line is provided between the "H" active enable input line of the address decoder and the low voltage common power supply, high frequency impedance of the "H" active enable input line is reduced and resistance against an external noise, which is mainly caused by an electrostatic discharge is improved. In addition, according to the present invention, since a resistor for discharging electricity in the capacitor when the external power supply is OFF is provided between the capacitor for reducing the high frequency impedance of the "H" active enable input line and the "H" active enable input line, an electric charge in the capacitor is slowly discharged and destruction of the inside stored data when the external power supply is OFF or at the time of memory backup by the internal battery is prevented, so that reliability is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An information card comprising:
   a plurality of volatile memory circuits for storing data;
   an internal battery for backing up data stored in the volatile memory circuits when a voltage supplied by an external power supply is below a predetermined voltage;
   power supply detecting means for outputting a power detection signal at a power detection output terminal when the voltage supplied by the external power supply exceeds the predetermined voltage;
   memory circuit enabling means for enabling changing of data stored in at least one of the volatile memory circuits, the memory circuit enabling means including a first enabling input terminal and a second enabling input terminal for receiving first and second enabling signals, respectively, for controlling the memory circuit enabling means, the second enabling input terminal receiving the power detection signal; and
   reducing means serially connected between the power detection output terminal and the first enabling input terminal for reducing high frequencies in the power detection signal and for preventing an electrostatic discharge from changing data stored in the volatile memory circuits.

2. An information card according to claim 1 wherein said memory circuit enabling means includes an address decoder and a buffer enable circuit having a buffer input terminal, a buffer output terminal, and producing a buffer output signal at the buffer output terminal, the address decoder being responsive to the first enabling input signal and to another enabling signal input to a third enabling input terminal, the buffer enable circuit responding to the second enabling input signal by controlling the buffer output signal, the buffer input terminal being connected to an external card enable terminal, and the buffer output terminal being connected to the third enabling input terminal.

3. An information card according to claim 2 wherein said reducing means comprises a resistor serially connected between the power detection output terminal and the first enabling input terminal and a capacitor connected between the first enabling input terminal and a ground.

* * * * *